(12) United States Patent
Takada et al.

(10) Patent No.: US 7,932,573 B2
(45) Date of Patent: Apr. 26, 2011

(54) MAGNETIC MEMORY ELEMENT AND MAGNETIC MEMORY DEVICE

(75) Inventors: Hiroshi Takada, Tokyo (JP); Takashi Takenaga, Tokyo (JP); Takeharu Kuroiwa, Tokyo (JP); Taisuke Furukawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/427,024

(22) Filed: Apr. 21, 2009

(65) Prior Publication Data

US 2009/0261435 A1 Oct. 22, 2009

(30) Foreign Application Priority Data

Apr. 22, 2008 (JP) ................................ 2008-111080

(51) Int. Cl.
*H01L 29/82* (2006.01)
(52) U.S. Cl. ........ 257/421; 257/422; 257/424; 257/427; 257/E29.167
(58) Field of Classification Search .................. 257/421, 257/422, 424, 427, E29.167
See application file for complete search history.

(56) References Cited

U.S. PATENT DOCUMENTS

| 6,980,468 | B1 * | 12/2005 | Ounadjela | ..................... 365/171 |
| 2005/0012129 | A1 * | 1/2005 | Saito | ............................. 257/296 |
| 2005/0116308 | A1 * | 6/2005 | Bangert | ........................ 257/421 |

OTHER PUBLICATIONS

Huai, Y., et al. "Observation of spin-transfer switching in deep submicron-sized and low resistance magnetic tunnel junctions", Applied Physics Letters, Apr. 19 2004, pp. 3118-3120, vol. 84 No. 16, American Institute of Physics.
Albert, F.J., et al., "Spin-polarized current switching of a Co thin film nanomagnet", Applied Physics Letters, Dec. 4, 2000, pp. 3809-3811, vol. 77 No. 23, American Institute of Physics.

* cited by examiner

*Primary Examiner* — Tan N Tran
(74) *Attorney, Agent, or Firm* — McDermott Will & Emery LLP

(57) ABSTRACT

A magnetic memory element having a layer structure containing a fixing layer (pinned layer: PL) having a magnetization direction fixed unidirectionally, a nonmagnetic dielectric layer (TN1) in contact with the fixing layer (PL), and a memory layer (free layer: FL) having a first surface in contact with the nonmagnetic dielectric layer (TN1) and a second surface on the opposite to the first surface, the magnetization direction of the memory layer (FL) having a reversible magnetization direction in response to the current through the layer structure. The entire surface of the first surface of the memory layer (FL) is covered with the nonmagnetic dielectric layer (TN1) and in the joint surface of the nonmagnetic dielectric layer (TN1) and the fixing layer (PL), the first surface of the nonmagnetic dielectric layer (TN1) is exposed in a manner of surrounding the joint surface.

4 Claims, 7 Drawing Sheets

MAGNETIC MEMORY ELEMENT AND MAGNETIC MEMORY DEVICE

CROSS-REFERENCE TO RELATED APPLICATION

The disclosure of Japanese Patent Application No. 2008-111080 filed on Apr. 22, 2008 including specification, drawings and claims is incorporated herein by reference in its entirely.

BACKGROUND OF THE INVENTION

1. Field of the Invention

The present invention relates to a magnetic memory element and a magnetic memory device, particularly a magnetic memory element and a magnetic memory device capable of rewriting information by flowing spin-polarized electrons to the magnetic element.

2. Description of the Related Art

As a nonvolatile magnetic memory device of the next generation, a MRAM (Magnetic Random Access Memory) device has drawn attention. The MRAM device is a nonvolatile magnetic memory device which can store nonvolatile data using a plurality of memory cells of thin film magnetic layers formed in a semiconductor integrated circuit and at the same time which allows random access to the respective memory cells.

Each of such memory cells includes a magnetoresistive element with a sandwich structure formed by arranging a fixing layer of a ferromagnetic layer having a fixed magnetization direction and a recording layer of a ferromagnetic layer having a magnetization direction varied in accordance with an outside magnetic field while inserting a nonmagnetic layer between them. The magnetoresistive element stores data while making the data relevant to the alteration of electric resistance values generated correspondingly to the alteration of the magnetization direction of the recording layer. The alteration of the electric resistance values can be classified into a tunnel magneto resistive effect and a giant magneto resistive effect in accordance with the principles and it has been known well that the capability of the MRAM device can remarkably be improved by using a magnetoresistive element based on the tunnel magneto resistive effect.

STT-MRAM (Spin Transfer Torque-MRAM) using a method for inverting the magnetization direction of a memory layer by flowing spin-polarized electrons to the magnetic layer as a method for inverting the magnetization of the memory layer is reported (e.g., F. J. Albert, et al., Appl. Phy. Lett. Vol. 77, P. 3809 (2000), Y. Huai, et al., Appl. Phy. Lett. Vol. 84, P. 3118 (2004)). Such magnetization inversion manner by spin injection is based on the principle that the spin can be transmitted by interaction of the spin angular momentum of electrons with the angular momentum of the magnetic layer. It is characterized in that as the size of the memory cell becomes smaller, the current needed for magnetization inversion of the memory layer is made smaller and thus this method can be said to be a memory method suitable for a nonvolatile magnetic memory device with high capacity.

SUMMARY OF THE INVENTION

However, in the magnetization inversion manner by spin injection, the current density necessary for the magnetization inversion is about $1 \times 10$ MA/cm$^2$ and in a magnetoresistive element using a single-domain structure, writing current of several mA is required. Therefore, it is needed to lower the writing current corresponding to the restriction by wiring and increase of the memory cells.

Further, since the inversion energy of the magnetization in the center part of the memory layer is high as compared with that in the peripheral part, even if the magnetization is inverted in the peripheral part, the magnetization cannot be inverted in the center part in some cases.

Furthermore, the magnetic characteristics in the peripheral part of the memory layer are sometimes deteriorated due to damages or the like at the time of processing a magnetoresistive element and there is a problem that even if current is applied to the peripheral part of the memory layer, it does substantially not contribute to the magnetization inversion of the memory layer.

Therefore, with respect to a magnetic memory element of a magnetization inversion type by spin injection and a magnetic memory device, an object of the present invention is to provide a magnetic memory element and a magnetic memory device having low inversing current and good magnetic characteristics.

The invention provides a magnetic memory element having a layer structure containing a fixing layer (pinned layer: PL) having a magnetization direction fixed unidirectionally, a nonmagnetic dielectric layer (TN1) in contact with the fixing layer (PL), and a memory layer (free layer: FL) having a first surface in contact with the nonmagnetic dielectric layer (TN1) and a second surface on the opposite to the first surface, and the magnetization direction of the memory layer (FL) has a reversible magnetization direction in response to the current through the layer structure, wherein the entire surface of the first surface of the memory layer (FL) is covered with the nonmagnetic dielectric layer (TN1) and in the joint surface of the nonmagnetic dielectric layer (TN1) and the fixing layer (PL), the first surface of the nonmagnetic dielectric layer (TN1) is exposed in a manner of surrounding the joint surface.

Further, the present invention also provides a magnetic memory device containing the magnetic memory element arranged in a matrix-like arrangement.

The present invention thus provides a magnetic memory element and a magnetic memory device which enables rewriting of information by using low current and has good magnetic characteristics.

DETAILED DESCRIPTION OF THE PREFERRED EMBODIMENTS

Hereinafter, preferred embodiments of the present invention will be described with reference to drawings. In the following explanation, names including terms, "upper", "lower", "left" and "right", are used properly; however these directions are used only for making the present invention easily understandable with reference to the drawings and thus configurations inverting the embodiments in an upper or lower direction or rotating in an arbitrary direction are also regarded to be within the scope of the present invention.

Embodiment 1

Figure 1:
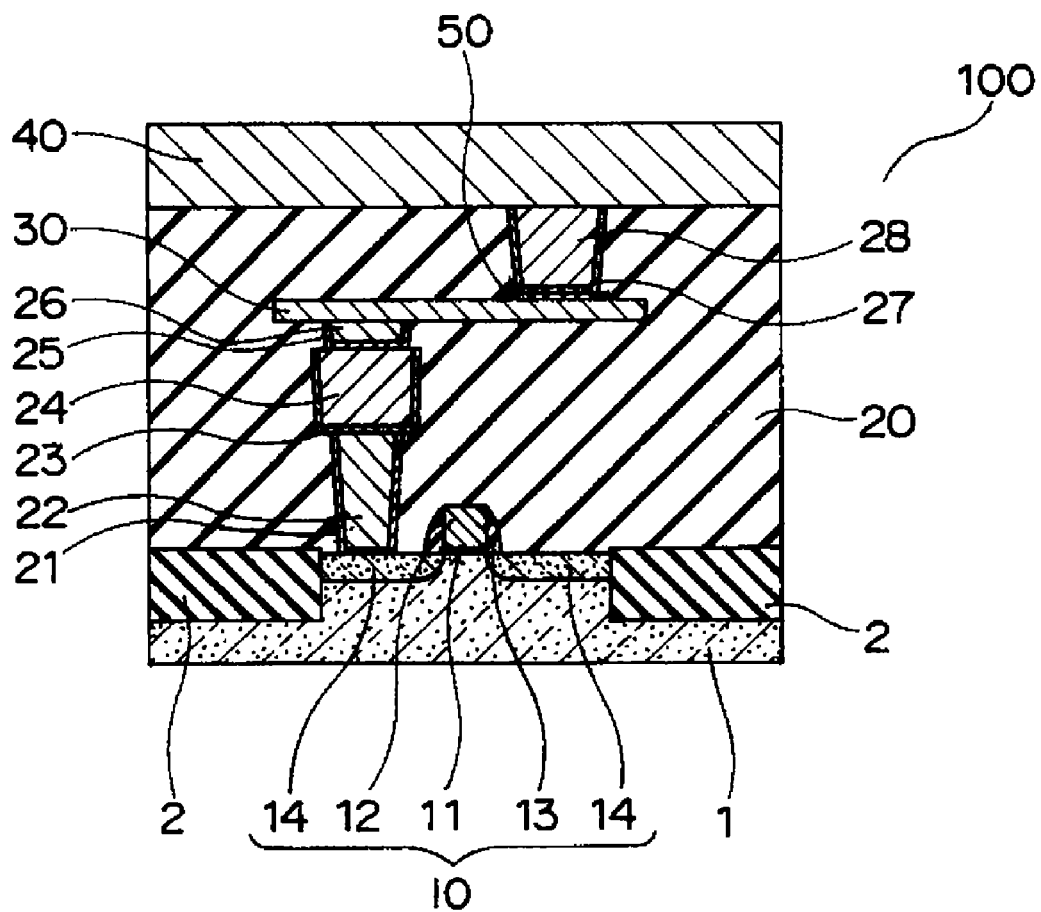
FIG. 1 is a partial cross-sectional view of a magnetic memory device of the embodiment 1 of the present invention.

FIG. 1 shows a partial cross-sectional view of a magnetic memory device (STT-MRAM) (Spin Transfer Torque-MRAM) according to the embodiment of which the entire body is denoted with 100.

The magnetic memory device 100 contains a semiconductor substrate 1 of silicon or the like. An element separation insulating film 2 of silicon oxide or the like is formed in the semiconductor substrate 1. A transistor 10 for selecting elements is formed in the element formation region separated by the element separation insulating film 2. The transistor 10 contains a gate insulating layer 11 formed on the semiconductor substrate 1 and a gate electrode 12 formed thereon. A side wall 13 of silicon oxide or the like is formed in both sides of the gate electrode 12. A source/drain region 14 is formed in the semiconductor substrate 1 in a manner that the gate electrode 12 is sandwiched.

An interlayer insulating layer 20 of, for example, silicon oxide is formed on the semiconductor substrate 1. In the interlayer insulating layer 20, a contact plug 22 of, for example, tungsten is embedded via a barrier metal layer 21 of, for example, TiN/Ti. The contact plug 22 is electrically connected to the source/drain region 14.

On the contact plug 22, a contact plug 24 of, for example, copper is embedded via a barrier metal film 23 of, for example, TaN/Ta and on the contact plug 24, a contact plug 26 of, for example, copper is embedded via a barrier metal film 25.

A lead wire 30 made of, for example, copper is formed on the contact plug 26 and the above-mentioned magnetic memory element (TMR (Tunneling Magneto Resistance) element) 50 is formed further thereon and a contact plug 28 of, for example, copper is embedded on the magnetic memory element 50 via a barrier metal film 27 of, for example, TaN/Ta.

A bit line (BL) 40 of, for example, copper is formed on the interlayer insulating layer 20 while being connected with the contact plug 28.

Figure 2:
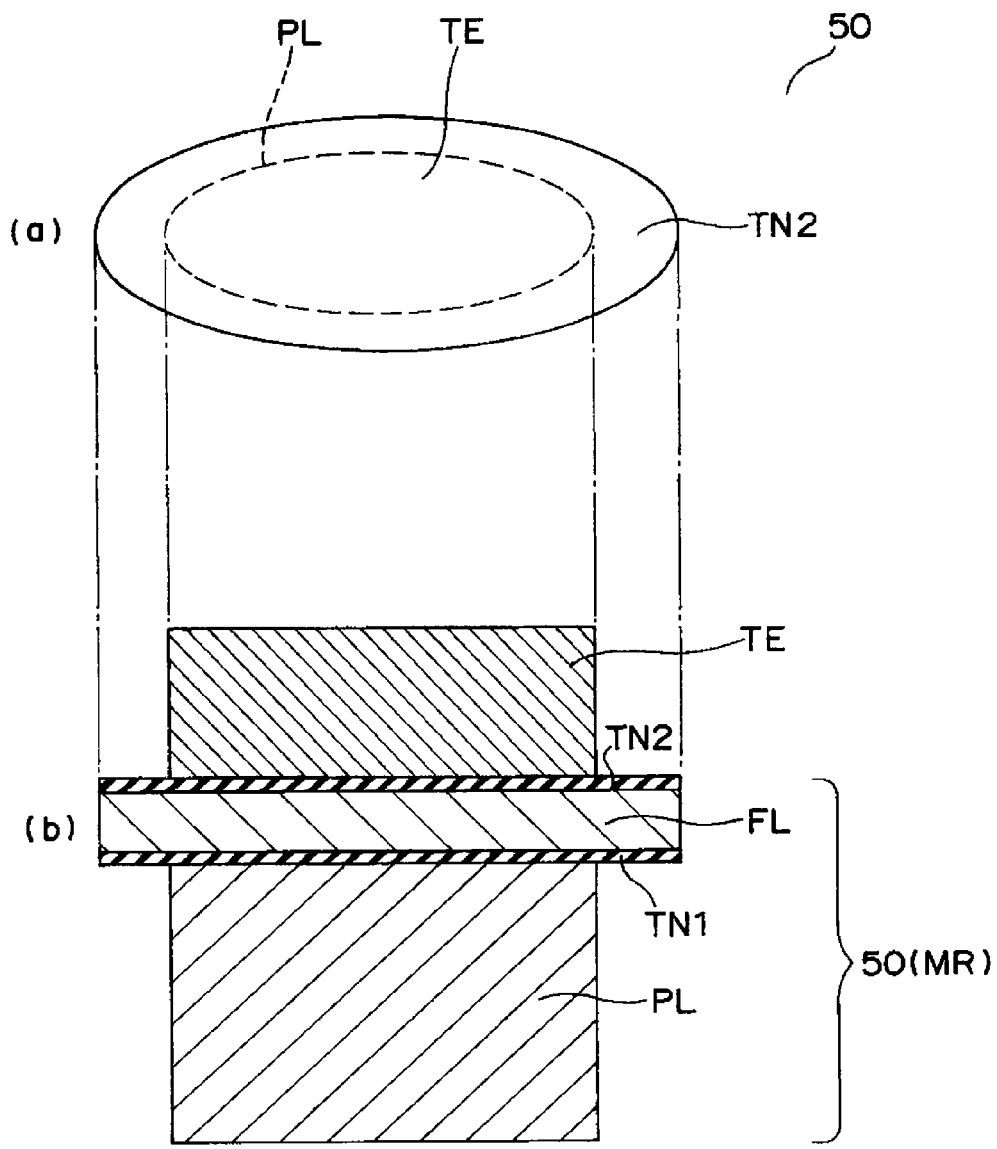
FIG. 2 is a magnified drawing of a magnetic memory element of the embodiment 1 of the present invention.

FIG. 2 is magnified drawings of the magnetic memory element 50 of FIG. 1 and FIG. 2(a) shows a top drawing and FIG. 2(b) shows a cross-sectional view. The magnetic memory device 100 has a structure that a plurality of magnetic memory elements 50 are arranged in a matrix-like state. Although not illustrated in FIG. 1, a top electrode (TE) of, for example, Ta is formed between the magnetic memory elements 50 and the barrier metal film 25.

The magnetic memory element 50 includes a lead-out electrode 30 and a fixing layer (PL) connected to the lead-out electrode 30. On the fixing layer (PL), tunnel insulating layers (TN1) and (TN2) of nonmagnetic materials (dielectrics) and a memory layer (FL) of ferromagnetic layer sandwiched between the tunnel insulating layers (TN1) and (TN2) are formed. The above-mentioned top electrode (TE) is formed on the tunnel insulating layer (TN2).

For the fixing layer (PL), a structure formed by switched connection of an antiferromagnet such as PtMn, IrMn, FeMn, PtCrMn, NiMn, NiO, $Fe_2O_3$ and the like with one or a plurality of ferromagnets such as Co, Fe, Ni, Al, B, Si, Zr, Nb, Cr, Ta, and the like, or a structure formed by layering a SAF structure (Synthetic Antiferromagnet structure), which is formed by connecting a ferromagnet and a ferromagnet through a thin nonmagnetic layer, on an antiferromagnetic layer.

Further, for the tunnel insulating layers (TN1) and (TN2), oxides or nitrides containing, for example, MgO, $AlO_x$, $SiO_x$, AlN, SiN and the like or materials obtained by mixing them may be used.

Furthermore, the memory layer (FL) contains ferromagnets of one or a plurality of Co, Fe, Ni, Al, B, Si, Zr, Nb, Cr, Ta, and the like and it is preferable to use the same material as that of the ferromagnet to be used for the fixing layer (PL), however a different ferromagnetic material may be used.

With respect to the magnetic memory element 50 according to the embodiment 1, as shown in FIG. 2, the tunnel insulating layers (TN1) and (TN2) are formed in both surfaces of the memory layer (FL). The top electrode (TE) is formed on the top surface of the tunnel insulating layer (TN2). The end part (outer rim) of the top electrode (TE) is arranged in the inner side of the end part (outer rim) of the memory layer (FL).

Further, the distance of the end part (outer rim) of the top electrode (TE) and the end part (outer rim of the tunnel insulating layer (TN2)) of the memory layer (FL) is preferable to be equal to or more than the thickness of the memory layer (FL). Generally, the processing damages of the memory layer (FL) are slight and exist at least in the range of this distance from the end part.

Furthermore, the fixing layer (PL) is formed in the down surface of the tunnel insulating layer (TN1). The end part of the fixing layer PL is arranged in the inner side than the rim part of the memory layer (FL). In FIG. 2(a), the fixing layer (PL) is formed at the position (approximately the corresponding position) symmetric to the top electrode (TE) while sandwiching the memory layer (FL) between them. The distance of the end part of the fixing layer PL and the end part of the memory layer FL is preferable to be equal to or more than the thickness of the memory layer (FL).

In the magnetic memory element 50 according to this embodiment 1, among electrons injected from the fixing layer (PL) (current flows to the fixing layer (PL) from the top electrode (TE)), the electrons having the spin direction same as the fixing layer (PL) pass the tunnel insulating layer (TN1) and the memory layer (FL) and flow to the top electrode (TE). At that time, since the tunnel insulating layer TN1 is of a dielectric, the electrons are not spread in the transverse direction in the dielectric and the electrons flow mainly to the center part of the memory layer (FL) and scarcely flow to the peripheral part.

Further, the top electrode (TE) is formed to be symmetric with the fixing layer (PL) while sandwiching the memory layer (FL) between them, the electrons flowing to the memory layer (FL) from the fixing layer (PL) flow to the top electrode (TE) without being spread to the peripheral part.

As described above, the electrons can be injected intensively to the center part of the memory layer (FL) and spin in the center part where inversion is harder than in the peripheral part can efficiently be inverted by employing such a structure.

Figure 3:
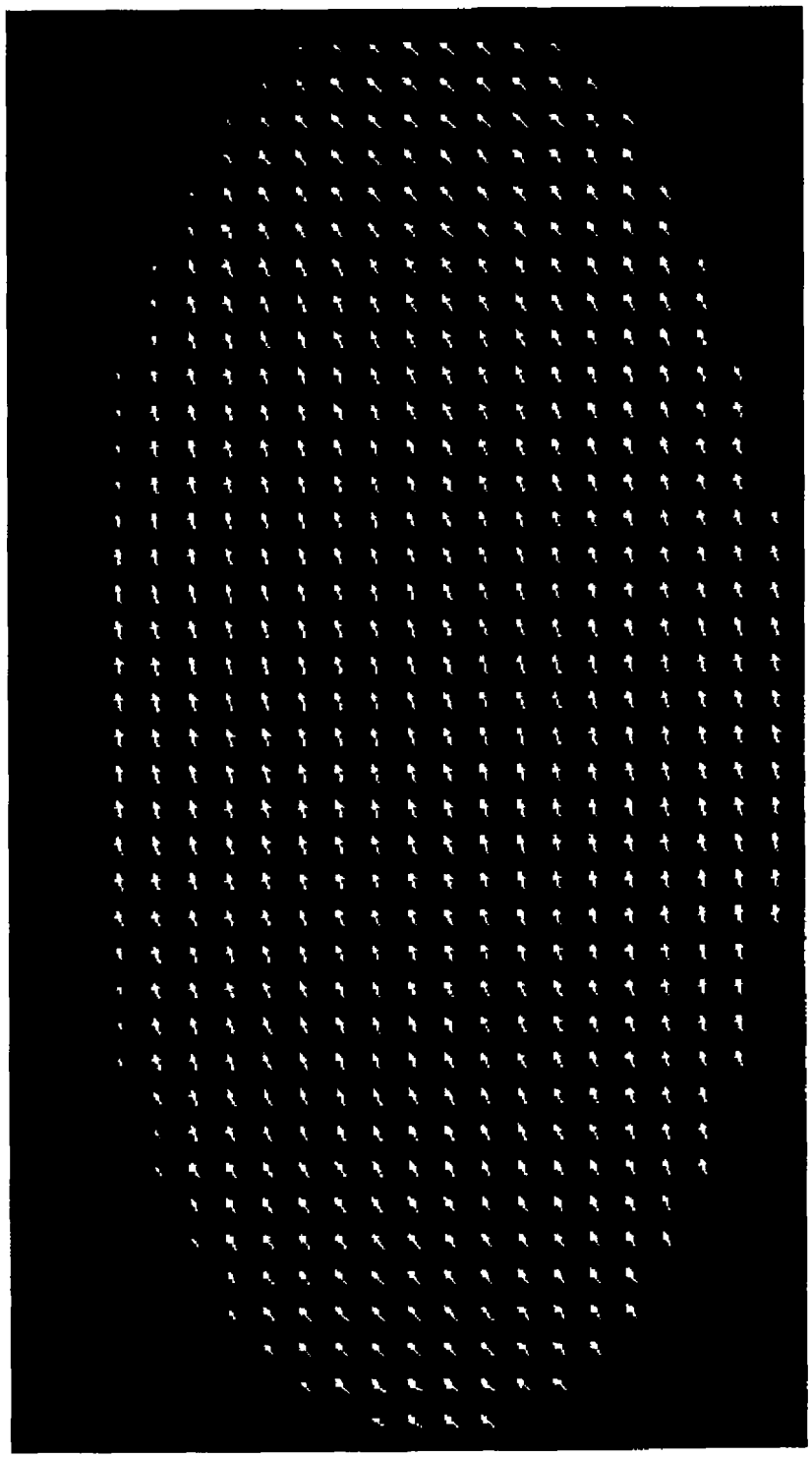
FIG. 3 is the result of simulation showing the spin direction of the memory layer (FL)

FIG. 3 shows the simulation result showing the direction of spin of the memory layer FL in the case a magnetic field is supplied from the right to the left in this plane. In FIG. 3, the elliptical part corresponds to the memory layer (FL). As being understood from FIG. 3, the spin direction in the peripheral part is slanted right as compared with the spin direction in the center part. This shows that the spin in the center part tends to be less altered in the direction than the spin in the peripheral part.

As described above, the inversion efficiency of the spin of the memory layer (FL) can be increased by applying current intensely to the center part of the memory layer (FL) in the magnetic memory element 50 and accordingly passing spin-polarized electrons only in the center part. As a result, rewriting of the magnetic memory element 50 can be carried out at low current.

Further, conventionally, in the case there is a region having processing damages in the peripheral part of the memory layer (FL), there is a problem that magnetization inversion of the memory layer (FL) cannot be caused practically in the peripheral part even if current is applied. To deal with this, in the magnetic memory element 50, since magnetization inversion in the center part of the memory layer (FL) is mainly caused, the effect of the damages in the peripheral part is hardly caused and thus the inversion efficiency is heightened. As a result, rewriting of the magnetic memory element 50 can be carried out by low current.

Figure 4:
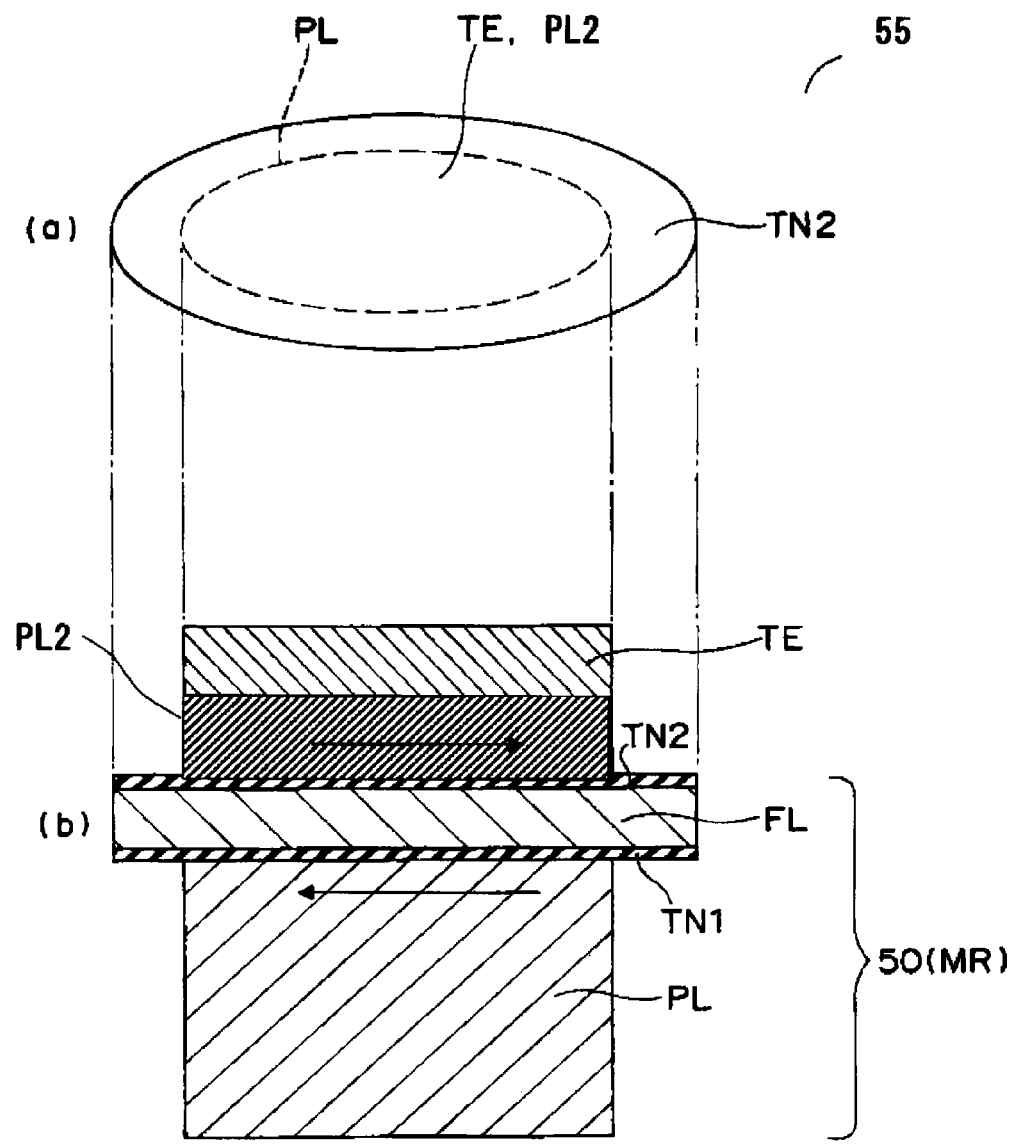
FIG. 4 is a magnified drawing of another magnetic memory element of the embodiment 1 of the present invention.

FIG. 4 shows a magnified drawing of another magnetic memory element of the embodiment 1 of which the entire body is denoted as 55, and FIG. 4(a) shows a top drawing and FIG. 4(b) shows a cross-sectional view. In FIG. 4, the symbols same as those in FIGS. 1 and 2 show the same or equivalent parts.

As shown in FIG. 4, in the magnetic memory element 55, a fixing layer (second pinned layer: PL2) having a fixed magnetization direction (often having opposed magnetization direction to the fixing layer (PL)) is formed in the top electrode (TE) and is used as a spin filter to further improve the inversion efficiency and lower the rewriting current.

Embodiment 2

Figure 5:
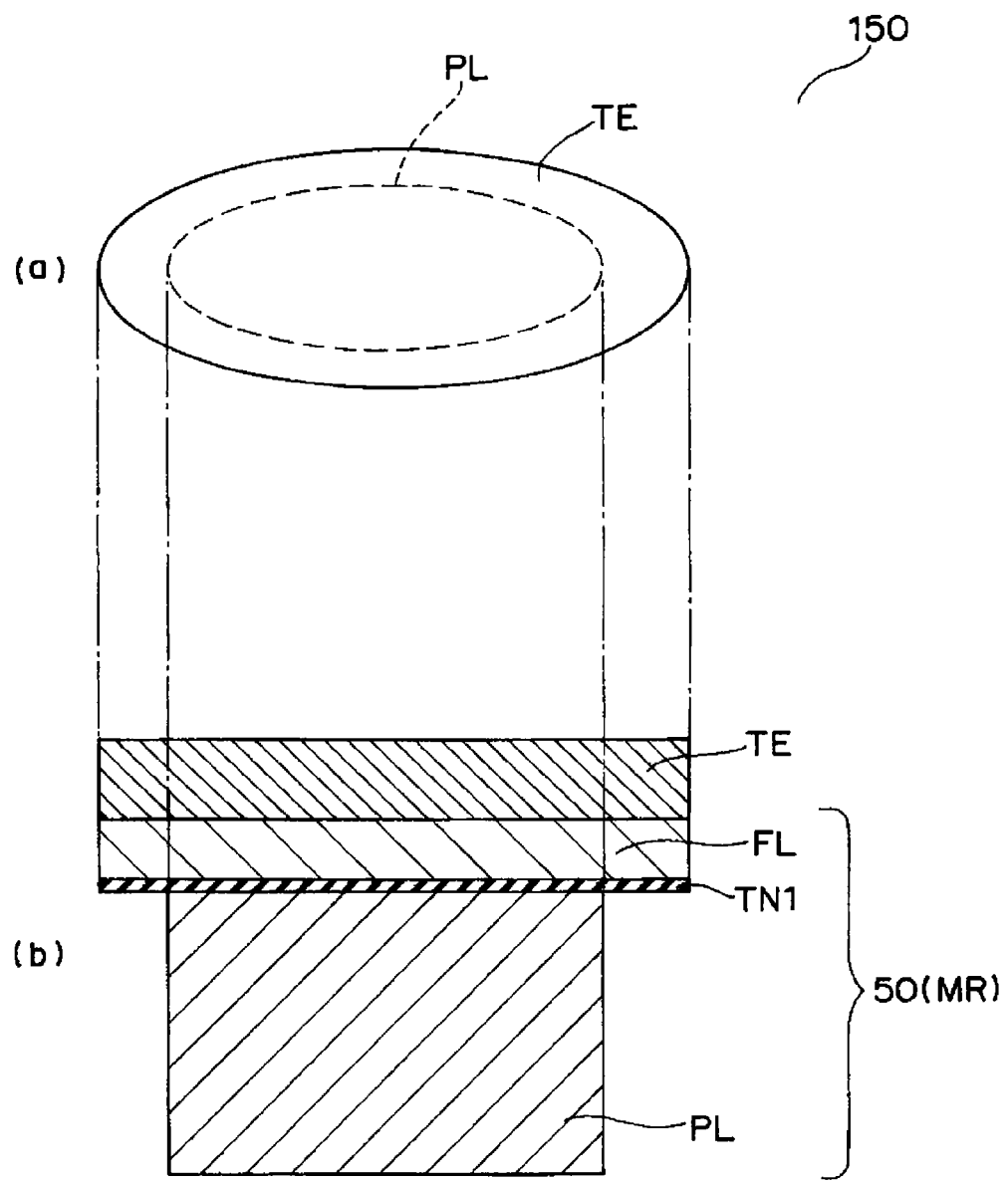
FIG. 5 is a magnified drawing of a magnetic memory element of the embodiment 2 of the present invention.

FIG. 5 show a magnified drawing of another magnetic memory element of the embodiment 2 of which the entire body is denoted as 150 and FIG. 5(a) shows a top drawing and FIG. 5(b) shows a cross-sectional view. In FIG. 5, the symbols same as those in FIGS. 1 and 2 show the same or equivalent parts.

The magnetic memory element 150 contains a fixing layer (PL) connected with a lead-out electrode 30. On the fixing layer (PL), a tunnel insulating layer (TN1) of a nonmagnet (dielectric), a memory layer (FL) of a ferromagnet, and a top electrode (TE) are successively layered.

In the magnetic memory element 150 of this embodiment 2, the end part of the fixing layer (PL) is arranged in the inner side than the end part of the tunnel insulating layer (TN1). Further, the distance between the end part of the fixing layer (PL) and the end part of the memory layer (FL) is preferable to be equal to or more than the thickness of the memory layer (FL). On the other hand, the top electrode (TE) is directly formed on the memory layer (FL) and the surface area is made also same.

In the magnetic memory element 150 of the embodiment 2, among electrodes injected from the fixing layer (PL), the electrons with the spin direction same as that in the fixing layer (PL) pass the tunnel insulating layer (TN1) and the memory layer (FL) and flow to the top electrode (TE). At that time, since the tunnel insulating layer TN1 is of a dielectric, the electrons in the dielectric are not spread in the transverse direction and the electrons flow mainly to the center part of the memory layer FL and do not flow to the peripheral part.

Further, since the surface area of the fixing layer PL is smaller than those of the tunnel insulating layer TN1 and the memory layer (FL), the electrons flowing to the fixing layer (PL) after passing the memory layer (FL) from the top electrode (TE) are not spread to the peripheral part. Therefore, electrons are not supplied to the peripheral part where the magnetization inversion is hardly caused due to the damages or the like but electrons are supplied mainly to the center part of the memory layer (FL), so that magnetization inversion of the spin in the center part of the memory layer (FL) can be caused prior and rewriting of the magnetic memory element 150 can be carried out by low current.

Embodiment 3

Figure 6:
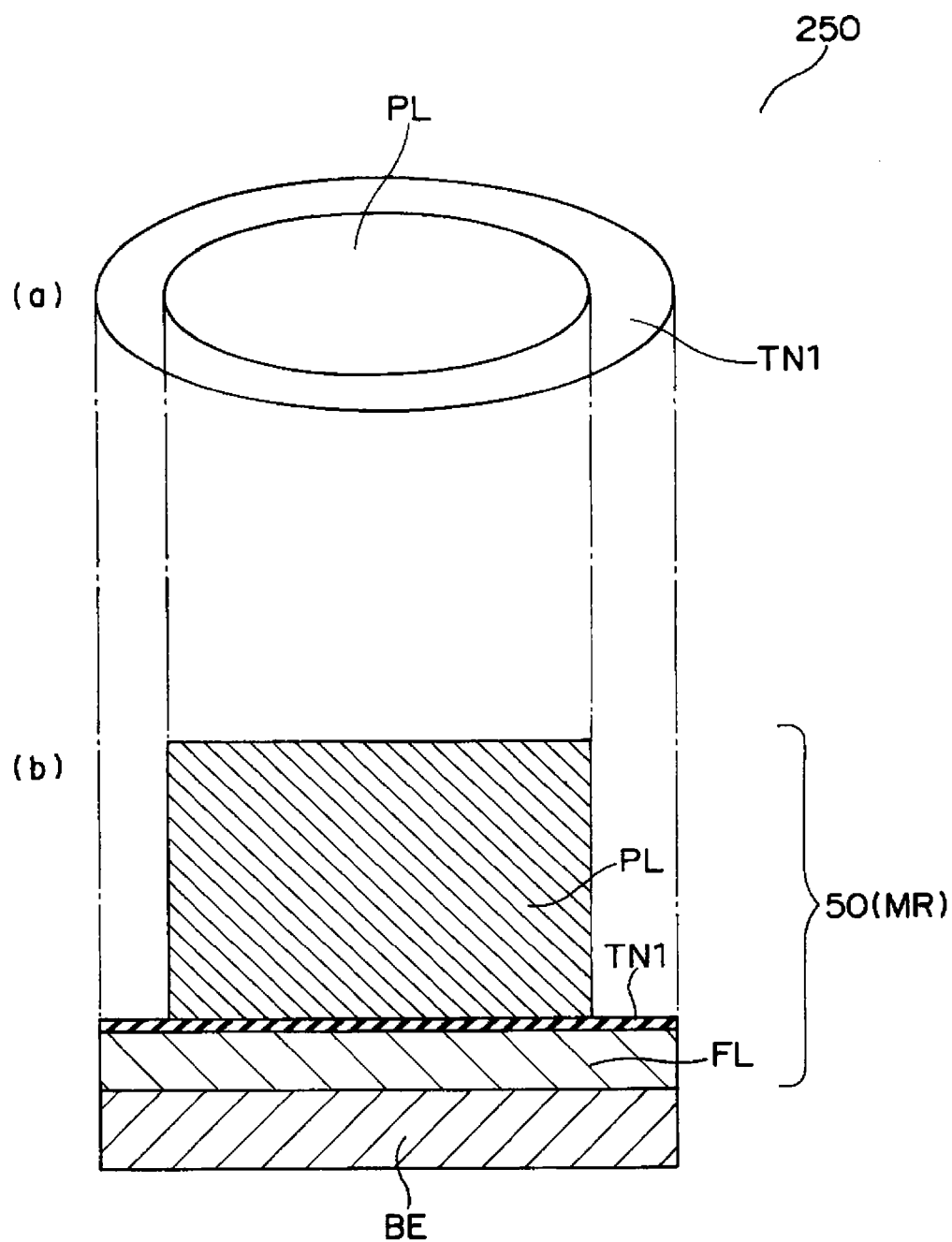
FIG. 6 is a magnified drawing of a magnetic memory element of the embodiment 3 of the present invention.

FIG. 6 show a magnified drawing of a magnetic memory element of the embodiment 3 of which the entire body is denoted as 250 and FIG. 6(a) shows a top drawing and FIG. 6(b) shows a cross-sectional view. In FIG. 6, the symbols same as those in FIGS. 1 and 2 show the same or equivalent parts.

The magnetic memory element 250 of the embodiment 3 has a structure formed reversely upside down to that of the magnetic memory element 150 of the embodiment 2.

That is, a memory layer (FL) and a tunnel insulating layer (TN1) are formed on a bottom electrode (BE) (equivalent to the lead-out layer 30 in FIG. 1) and a fixing layer (PL) is formed thereon. The end part of the fixing layer (PL) is arranged in the inner side than the end parts of the memory layer (FL) and the tunnel insulating layer (TN1). Further, the distance between the end part of the fixing layer (PL) and the end part of the memory layer FL is preferable to be equal to or more than the thickness of the memory layer (FL). In addition, on the fixing layer (PL), a top electrode (TE), which is not illustrated, is formed.

In the magnetic memory element 250 of the embodiment 3, similarly in the above-mentioned magnetic memory element 150, since electrons can be supplied mainly to the center part of the memory layer FL, magnetization inversion of the spin in the center part of the memory layer (FL) can be caused prior and rewriting of the magnetic memory element 250 can be carried out at low current.

Embodiment 4

Figure 7:
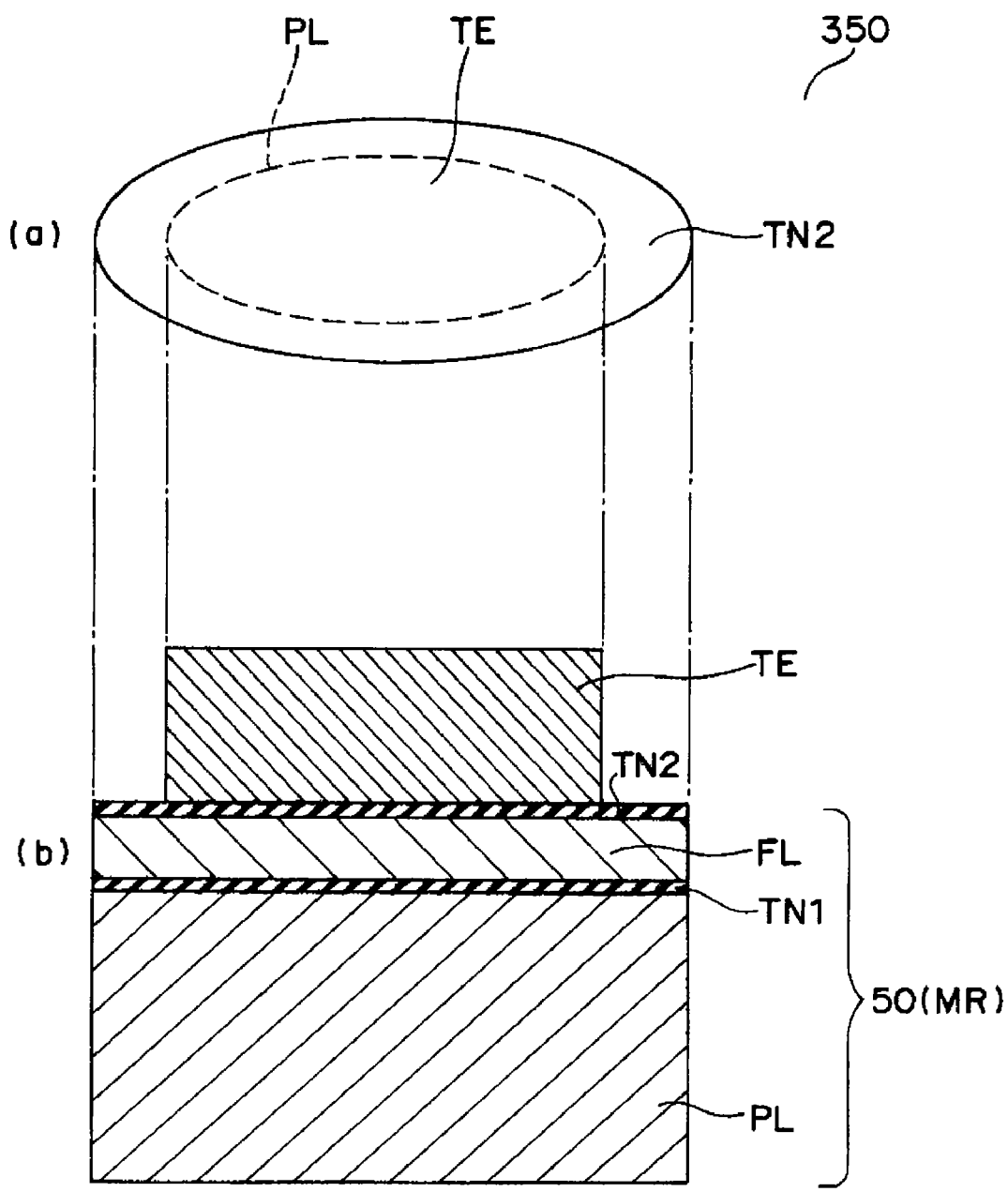
FIG. 7 is a magnified drawing of a magnetic memory element of the embodiment 4 of the present invention.

FIG. 7 show a magnified drawing of a magnetic memory element of the embodiment 4 of which the entire body is denoted as 350 and FIG. 7(a) shows a top drawing and FIG. 7(b) shows a cross-sectional view. In FIG. 7, the symbols same as those in FIGS. 1 and 2 show the same or equivalent parts.

The magnetic memory element 350 of the embodiment 4 is the magnetic memory element 50 of the embodiment of which only the top electrode is miniaturized.

Tunnel insulating layers (TN1) and (TN2) are formed in both surfaces of the memory layer (FL). The top electrode (TE) is formed on the top surface of the tunnel insulating layer (TN2). The end part (outer rim part) of the top electrode (TE) is arranged in the inner side than the end part (outer rim part) of the memory layer (FL). Further, the distance between the end part (outer rim part) of the top electrode (TE) and the end part (outer rim part) of the memory layer (FL) (outer rim of the tunnel insulating layer (TN2)) is preferable to be equal to or more than the thickness of the memory layer (FL).

In the magnetic memory element 350 of the embodiment 4, similarly in the above-mentioned magnetic memory element 250, since electrons can be supplied mainly to the center part of the memory layer FL, magnetization inversion of the spin in the center part of the memory layer (FL) can be caused prior and rewriting of the magnetic memory element 350 can be carried out by low current.

In addition, in the embodiments 1 to 4, the top surface shapes of the magnetic memory elements 50, 55, 150, 250, 350, and 450 are made to be elliptical, however the same effect can be cause even if the shapes are made to be others such as rectangular, circular, or polygonal. Further, the shapes of the top electrode TE made to have smaller surface area than the memory layer FL, the bottom electrode (BE), and the fixing layers (PL) and (PL2) are not needed to be analogous with that of the magnetic memory element and even if different shapes, a similar effect can be caused.

Furthermore, even in the magnetic memory elements shown as embodiments 2 to 4, as described for the embodiment 1, electrons having same spin can be injected and the inversion efficiency can be improved by forming a second fixing layer (PL2) magnetized in the opposed direction to that of the fixing layer (PL) in the metal electrode (TE) or the bottom electrode (BE) corresponding to the fixing layer (PL).

What is claimed is:

1. A magnetic memory element having a layer structure comprising:
   a fixing layer having a magnetization direction fixed unidirectionally,
   a first nonmagnetic dielectric layer in contact with the fixing layer,
   a memory layer having a first surface in contact with the first nonmagnetic dielectric layer and a second surface opposing the first surface, the magnetization direction of the memory layer having a reversible magnetization direction in response to the current through the layer structure,
   a second nonmagnetic dielectric layer in contact with the second surface of the memory layer, and
   a metal layer in contact with the second nonmagnetic dielectric layer, wherein
   the memory layer is larger than the fixing layer in plan view, and
   an end part of the fixing layer is arranged inside an end part of the memory layer in plan view,
   the memory layer is larger than the metal layer in plan view and an end part of the metal layer is arranged inside an end part of the memory layer in plan view, and
   the fixing layer is formed approximately corresponding position to the metal layer in plan view while sandwiching the memory layer therebetween.

2. The magnetic memory element according to claim 1, wherein the distance between an end part of the fixing layer and an end part of the memory layer is equal to or more than the thickness of the memory layer.

3. A magnetic memory device comprising the magnetic memory element according to claim 1 arranged in a matrix-like arrangement.

4. The magnetic memory element according to claim 1, wherein the distance between an end part of the metal layer and an end part of the memory layer is equal to or more than the thickness of the memory layer.

* * * * *